(12) United States Patent
Zhuang et al.

(10) Patent No.: US 7,585,788 B2
(45) Date of Patent: Sep. 8, 2009

(54) RARE EARTH ELEMENT-DOPED OXIDE PRECURSOR WITH SILICON NANOCRYSTALS

(75) Inventors: Wei-Wei Zhuang, Vancouver, WA (US); Yoshi Ono, Camas, WA (US); Sheng Teng Hsu, Camas, WA (US); Tingkai Li, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 677 days.

(21) Appl. No.: 11/224,549

(22) Filed: Sep. 12, 2005

(65) Prior Publication Data

US 2007/0238239 A1    Oct. 11, 2007

Related U.S. Application Data

(63) Continuation-in-part of application No. 11/039,463, filed on Jan. 19, 2005, now Pat. No. 7,256,426.

(51) Int. Cl.
*H01L 21/31* (2006.01)
(52) U.S. Cl. .................... 438/787; 438/789; 438/790; 257/E21.278
(58) Field of Classification Search ................. 438/778, 438/780, 781, 783, 787, 789, 790, 22, 29, 438/30, 45
See application file for complete search history.

(56) References Cited

U.S. PATENT DOCUMENTS 7,407,604 B2 *    8/2008    Kear et al. ............ 252/301.4 F

OTHER PUBLICATIONS

Maria E. Castagna, Salvatore Coffa, Mariantonietta Monaco, Anna Muscara, Liliana Caristia, Simona Lorenti, and Alberto Messina, "High Efficiency Light Emission Devices in Silicon", Mat. Res. Soc. Symp. Proc., vol. 770, 2003, pp. 12.1.1-12.1.12.

* cited by examiner

*Primary Examiner*—Hsien-ming Lee
(74) *Attorney, Agent, or Firm*—Law Office of Gerald Maliszewski; Gerald Maliszewski

(57) ABSTRACT

A method is provided for forming a rare earth element-doped silicon oxide ($SiO_2$) precursor with nanocrystalline (nc) Si particles. In one aspect the method comprises: mixing Si particles into a first organic solvent, forming a first solution with a first boiling point; filtering the first solution to remove large Si particles; mixing a second organic solvent having a second boiling point, higher than the first boiling point, to the filtered first solution; and, fractionally distilling, forming a second solution of nc Si particles. The Si particles are formed by immersing a Si wafer into a third solution including hydrofluoric (HF) acid and alcohol, applying an electric bias, and forming a porous Si layer overlying the Si wafer. Then, the Si particles are mixed into the organic solvent by depositing the Si wafer into the first organic solvent, and ultrasonically removing the porous Si layer from the Si wafer.

11 Claims, 6 Drawing Sheets

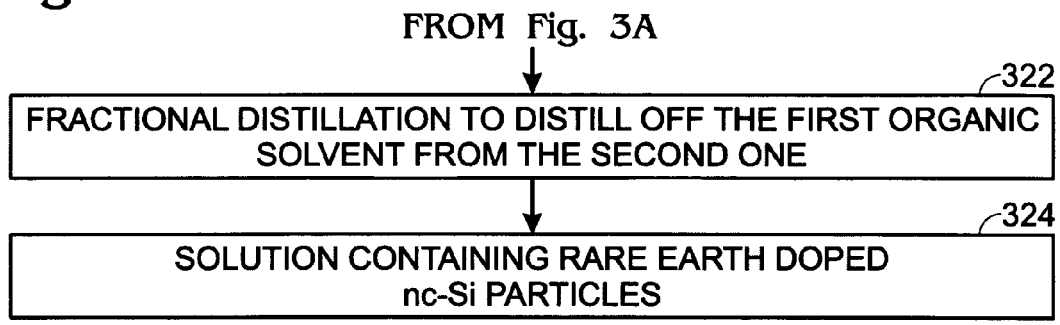
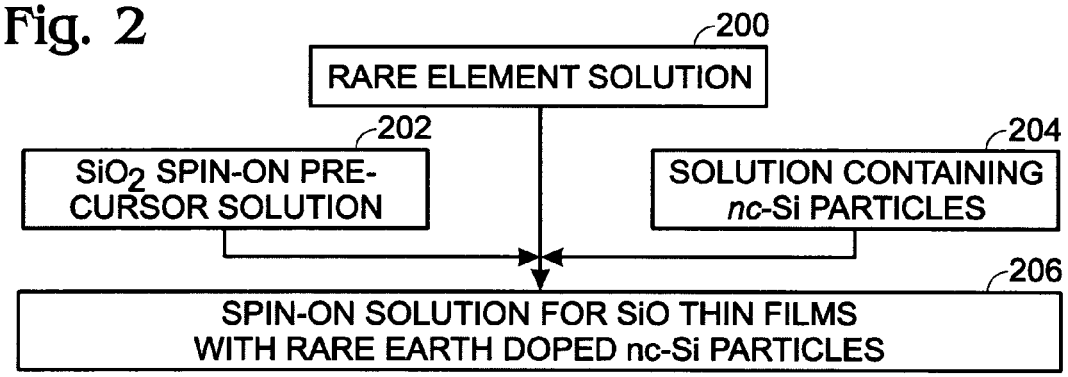
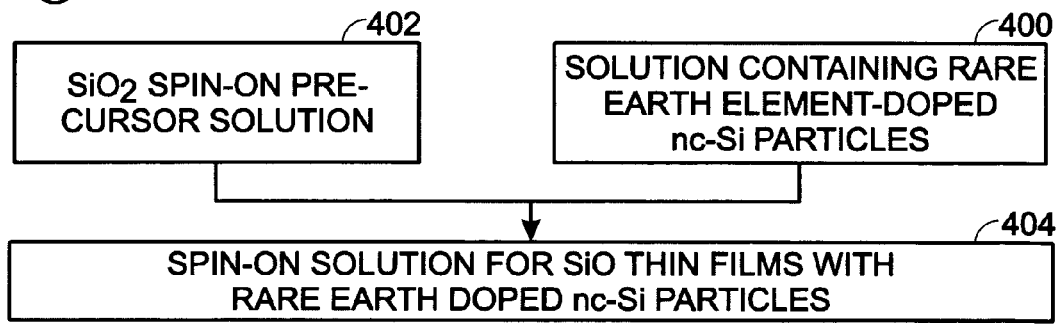

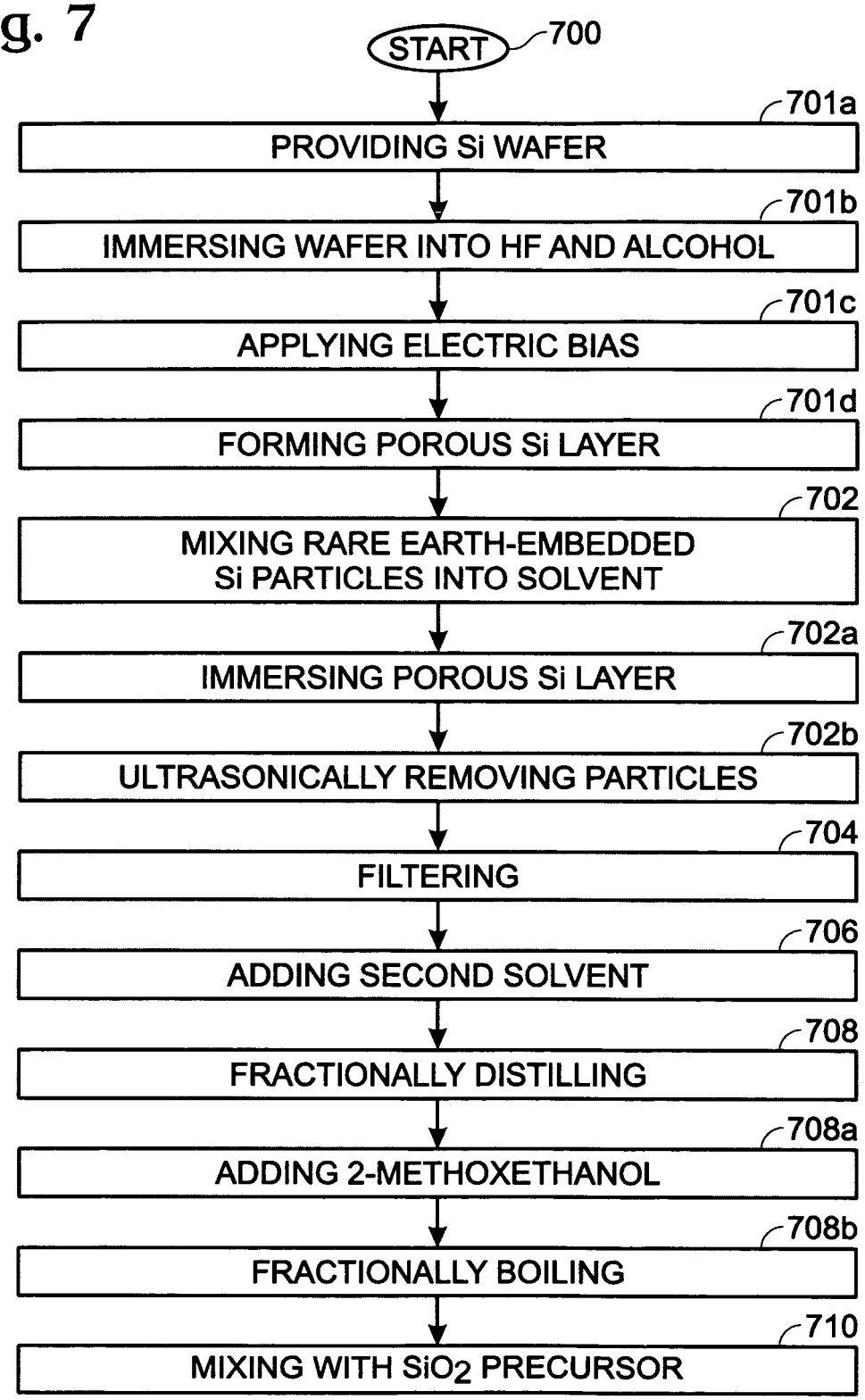

RARE EARTH ELEMENT-DOPED OXIDE PRECURSOR WITH SILICON NANOCRYSTALS

RELATED APPLICATIONS

The application is a continuation-in-part of a application entitled RARE EARTH ELEMENT-DOPED SILICON/SILICON DIOXIDE LATTICE STRUCTURE, invented by Li et al, Ser. No. 11/039,463, filed on Jan. 19, 2005 and issued as U.S. Pat. No. 7,256,426, which is incorporated herein by reference.

BACKGROUND OF THE INVENTION

1. Field of the Invention

This invention generally relates to integrated circuit (IC) fabrication and, more particularly, to a procedure for making a rare earth element-doped silicon oxide ($SiO_2$) precursor with nanocrystalline (nc) Si particles, for use in silicon-based electroluminescence (EL) devices.

2. Description of the Related Art

The observation of visible luminescence at room temperature, emanating from porous silicon (Si), has spurred a tremendous amount of research into using nano-sized Si to develop a Si-based light source. One widely used method of fabricating nanocluster Si (nc-Si) is to precipitate the nc-Si out of SiOx (x<2), producing a film using chemical vapor deposition (CVD), radio frequency (RF)-sputtering, and Si implantation, which is often called silicon-rich silicon oxide (SRSO). Er implantation, creating Er-doped nanocrystal Si, is also used in Si based light sources. However, state-of-the-art implantation processes have not been able to distribute the dopant uniformly, which lowers the light emitting efficiency and increases costs. At the same time, there has been no interface engineering sufficient to support the use of such a dopant. The device efficiency is very low and the process temperature is very high, which limits the device applications. In order to improve the device efficiency, a large interface area must be created between nanocrystal Si and $SiO_2$.

Silicon has conventionally been considered unsuitable for optoelectronic applications, due to the indirect nature of its energy band gap. Bulk silicon is indeed a highly inefficient light emitter. Among the different approaches developed to overcome this problem, quantum confinement in Si nanostructures and rare earth doping of crystalline silicon have received a great deal of attention. In particular, Si nanoclusters (nanocrystalline Si) embedded in $SiO_2$ have in recent years attracted the interest of the scientific community as a promising new material for the fabrication of a visible Si-based light source. Alternatively, Er-doped crystalline Si has been extensively studied to take advantage of the radiative intra-4f shell Er transition. Room temperature operating devices with efficiencies of around 0.05% have been achieved. However as mentioned above, the device efficiency is very low and the process temperature is very high, normally over 1100° C.

Based on one theory for the photoemission of Si—$SiO_2$ interface, Si 2p core-level shifts at the Si(001)-$SiO_2$ interface depend linearly on nearest-neighbor oxygen atoms. Second nearest-neighbor effects turn out to be negligibly small. Therefore, the photoemission spectra require that all Si in the oxidation state be present at the interface. That is, the making of a large area of Si—$SiO_2$ interface is a critical issue for EL device applications.

Other work (Castagna et al., "High Efficiency Light Emission Devices in Silicon") describes a silicon-based light source consisting of a MOS structure with nc-Si particles and Er implanted in a thin oxide layer. The device shows 10% external quantum efficiency at room temperature, which is comparable to that of light emitting diodes using III-V semiconductors. The device consists of a 750 Å thick silicon-rich oxide (SRO) gate dielectric layer doped with rare earth ions (Er, Tb, Yb, Pr, Ce) via implantation. After annealing at 800° C. for 30 minutes under nitrogen flux, the implantation defects are eliminated and the agglomeration of silicon in the SRO film is obtained. The agglomeration of silicon, as matter of fact, forms the silicon nanoclusters, which act as a classic sensitizer atom to absorb incident photonics for the transfer of energy to luminescent $Er^{3+}$ ions. The key feature of the silicon electroluminescent device is the SRO layer consisting of the nc-Si and the rare earth element doping. The nc-Si size is in the range of 10 to 30 Å.

SUMMARY OF THE INVENTION

Described herein is an economical procedure to form a precursor that can be used to deposit a film comprised of silicon oxide with a large number of nanocrystalline silicon particles, having a size of about 10 to 30 Å, with rare earth doping. In contrast to the conventional method of Si implantation to form nc-Si, the present invention process can be scaled to larger substrates with a lower cost of production.

The invention employs a chemical synthesis process to obtain the nc-Si layer with rare earth element doping, as opposed to a process that forms an SRO layer using ion implantation, followed by another implantation for rare earth doping. In contrast, the present invention synthesizes Si nanoclusters, followed by the incorporation of the nc Si particles with rare earth elements in a precursor solution. The rare earth doped nc-Si layer can then be formed by a spin-coating technique. The benefit of this process method is better control of the nc Si concentration in the SRO layer, lower cost, and the direct attachment of rare earth elements on the nc Si particle surface.

Accordingly, a method is provided for forming a rare earth element-doped silicon oxide ($SiO_2$) precursor with nanocrystalline (nc) Si particles. The method comprises: mixing Si particles into a first organic solvent, forming a first solution with a first boiling point; filtering the first solution to remove large Si particles; mixing a second organic solvent having a second boiling point, higher than the first boiling point, to the filtered first solution; and, fractionally distilling, forming a second solution of nc Si particles.

The Si particles are formed by immersing a Si wafer into a third solution including hydrofluoric (HF) acid and alcohol, applying an electric bias to the Si wafer, and forming a porous Si layer overlying the Si wafer. Then, the Si particles are mixed into the organic solvent by depositing the Si wafer into the first organic solvent, and ultrasonically removing the porous Si layer from the Si wafer.

The method further comprising: mixing rare earth element particles into the second solution; and, simultaneously mixing the second solution with a spin-on precursor solution for $SiO_2$ thin films, creating a $SiO_2$ precursor including nc Si and rare earth particles.

Details of the above-described method and a variation of this method are proved in more detail below.

BRIEF DESCRIPTION OF THE DRAWINGS

FIG. 2 is a diagram depicting a process for combining the nc Si solution of FIG. 1 with a SiO$_2$ precursor and a rare earth element-doped solution.

FIGS. 3A and 3B are diagrams depicting a process for forming a solution with nc Si and rare earth particles.

FIG. 4 is a diagram depicting the combination of the solution of FIG. 3 with a SiO$_2$ precursor.

FIG. 7 is a flowchart illustrating a variation in the method for forming a rare earth element-doped SiO$_2$ precursor with nc Si particles.

DETAILED DESCRIPTION

Figure 1:
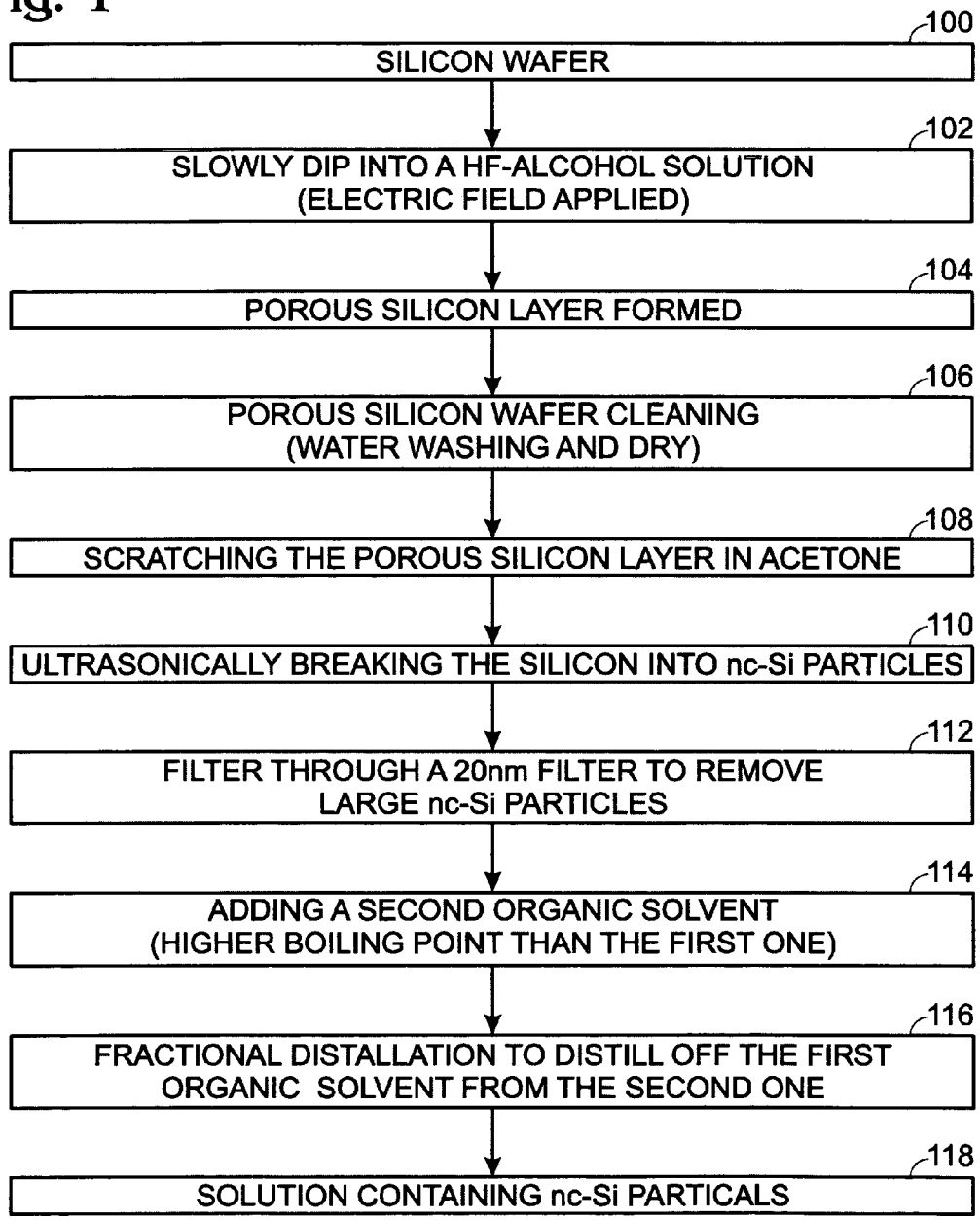
FIG. 1 is a diagram depicting a process for forming a nc Si solution.

FIG. 1 is a diagram depicting a process for forming a nc Si solution. The synthesis of nc Si particles includes four basic steps. In the first basic step (Steps 100-108), a porous silicon layer is formed through an electrochemical etch process. The solution for the electrochemical process is the mixture of HF (about 49%) and alcohol, such as the methanol or ethanol. The porous silicon layer is formed by slowly immersing the wafer into the solution while keeping an electrical bias on the wafer. The thickness of the resulting porous silicon layer depends on the immersion speed, current density, solution concentration, and wafer properties.

The second step (Step 110) is the transfer of the porous silicon layer into an organic solvent. An ultrasonic treatment can be used in the step to separate the porous silicon layer from the wafer. The solvents used in this step include a strong polar organic solvent, such as acetone or tetrahydrofuran.

After transfer, the nc Si particles need to be separated from the mother solution. The third basic step (Step 112) is a filtration process. The filter paper used in this step has a pour size of about 200 Å, to remove the larger particles.

The fourth basic step (Steps 114-118) is the transfer of the nc Si particles to the designed solution via fractional distillation. The low boiling point acetone is removed in this step, and the nc Si particles are kept in a remaining high boiling point organic solvent, such as 2-methoxyethanol. The process continues to remove solvent via distillation, giving the final solution a desired nc Si particle concentration.

Generally, there are two ways to add a rare earth element. The first method is by dipping a porous silicon wafer into a rare earth containing solution, and then applying an electric field to embed the rare earth element into the porous silicon surface. In the second method, the filtered nc Si particles are directly combined into a rare earth-containing organic solution.

FIG. 2 is a diagram depicting a process for combining the nc Si solution of FIG. 1 (Step 204) with a SiO$_2$ precursor (Step 202) and a rare earth element-doped solution (Step 200). Using the nc Si particle precursor (Step 206), silicon rich oxide (SRO) thin films can easily be deposited by the spin-coating technique. The concentration of nc Si particles in SRO thin films can be estimated by measuring the refractive index of the thin films.

Figure 3A:
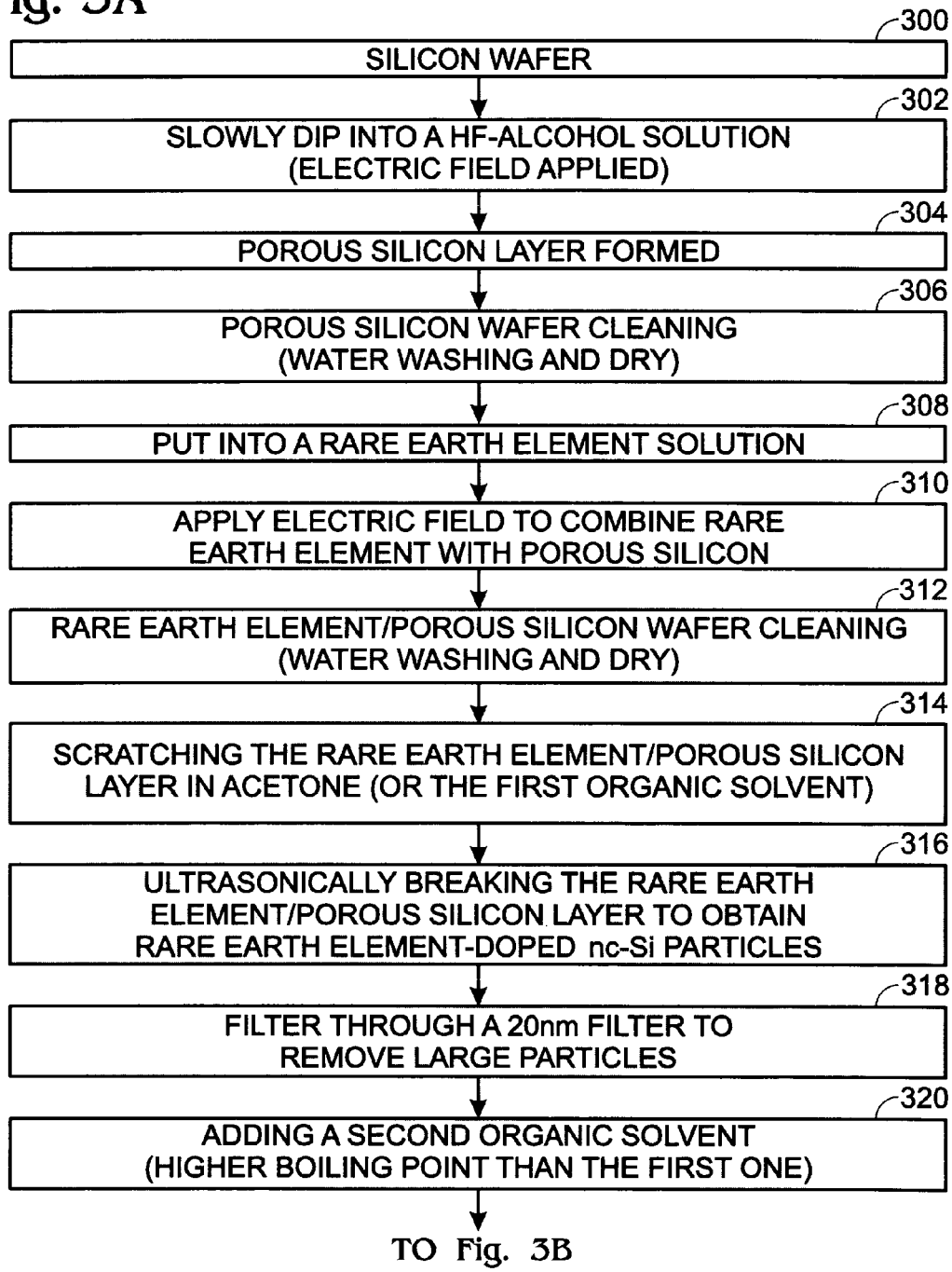

FIGS. 3A and 3B are diagrams depicting a process for forming a solution with nc Si and rare earth particles. Nanocrystalline Si particles can be successfully synthesized by using the electrochemical etch method, in which methanol and HF (about 49%) are used as the etching solution. The wafer is slowly immersed into the solution at a speed of about 0.5 millimeters (mm)/minute and later mixed with a rare earth element solution and processed so that rear earth element particles are embedded in the porous Si (Steps 300-312). The porous silicon layer is scratched off the wafer surface (Step 314), and given an ultrasonic treatment in acetone solvent (Step 316). After filtration through about a 200 Å filter (Step 318), the solution is combined with 2-methoxyethanol (Step 320), from which the acetone is distilled off (Step 322). The product solution (Step 324) is made further concentrated by continued distillation.

FIG. 4 is a diagram depicting the combination of the solution of FIG. 3 (Step 400) with a SiO$_2$ precursor (Step 402). After being combined with a spin-on precursor solution, a SRO thin film can be formed from the precursor (Step 404) using a spin-on deposition process.

Figure 5:
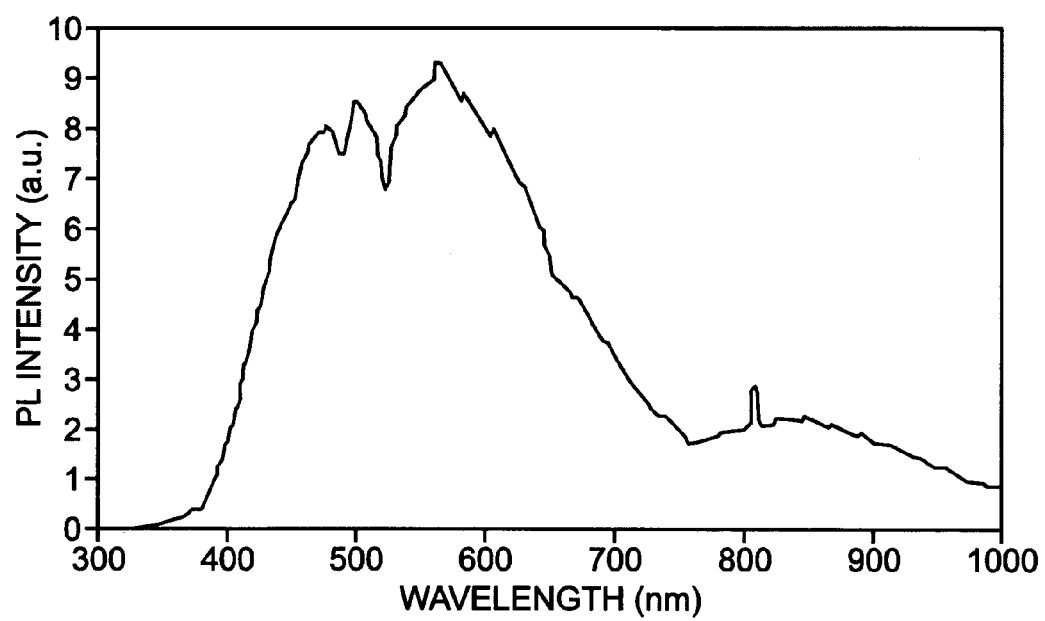
FIG. 5 is a diagram of a PL intensity measurement of a thin film formed using the present invention precursor.

FIG. 5 is a diagram of a PL intensity measurement of a thin film formed using the present invention precursor. The film shows a strong PL signal at about 590 nanometers (nm).

Figure 6:
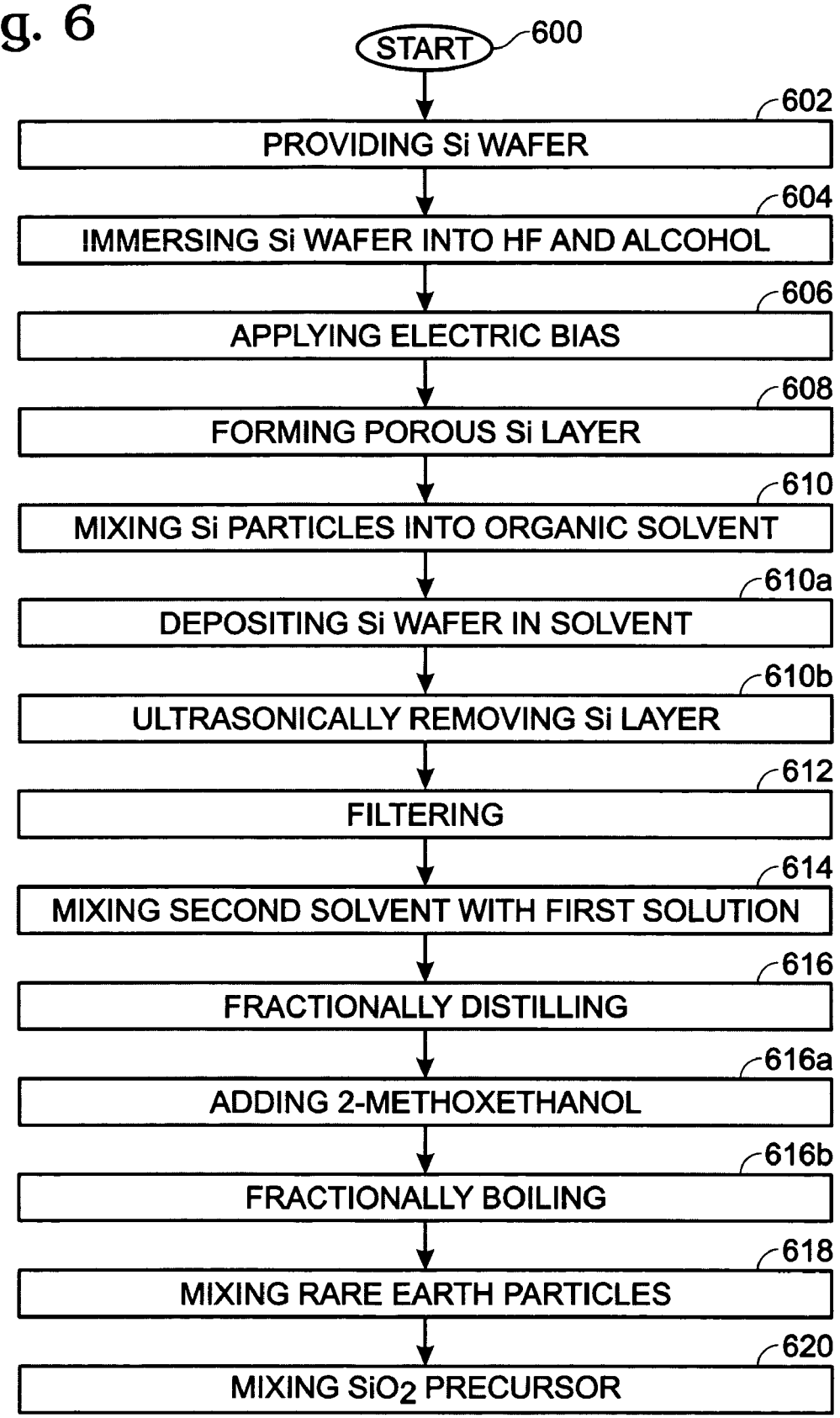
FIG. 6 is a flowchart illustrating a method for forming a rare earth element-doped silicon oxide (SiO$_2$) precursor with nc Si particles.

FIG. 6 is a flowchart illustrating a method for forming a rare earth element-doped silicon oxide (SiO$_2$) precursor with nc Si particles. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 provides a Si wafer. Step 604 immerses the Si wafer into a third solution including hydrofluoric (HF) acid and alcohol. In one aspect, Step 604 immerses the Si wafer at a rate in the range of about 0.1 to 0.5 millimeters per minute (mm/min). In another aspect, Step 604 uses about 49% HF and an alcohol such as methanol or ethanol.

Step 606 applies an electric bias to the Si wafer. Step 608 forms a porous Si layer overlying the Si wafer. Step 610 mixes Si particles into a first organic solvent, forming a first solution with a first boiling point. The first solvent can be acetone and tetrahydrofuran, however, other solvents could also be used. In one aspect, mixing Si particles into the organic solvent in Step 610 includes substeps. Step 610a deposits the Si wafer into the first organic solvent. Step 610b ultrasonically removes the porous Si layer from the Si wafer.

Step 612 filters the first solution to remove large Si particles. Typically, Si particles larger than about 200 Å are removed in this step. Step 614 mixes a second organic solvent having a second boiling point, higher than the first boiling point, to the filtered first solution. Step 616 fractionally distills, forming a second solution of nc Si particles. In one aspect, forming the second solution in Step 616 includes substeps. Step 616a adds 2-methoxethanol to the second solution, and Step 616b fractionally boils to distill off the first solvent.

Step 618 mixes rare earth element particles into the second solution, creating a fourth solution. Step 620 simultaneously (with Step 618) mixes the fourth solution with a spin-on precursor solution for SiO$_2$ thin films, creating a SiO$_2$ precursor including nc Si and rare earth particles. The rare earth element particles can be erbium (Er), ytterbium (Yb), cerium (Ce), praseodymium (Pr), or terbium (Tb).

Precursors for spin-coating SiO$_2$ thin films can be produced by mixing silicon alkoxide or silicon carboxylate in a specially designed organic solvent, in which the silicon alkoxide or silicon carboxylate can be produced via a reaction between SiCl$_4$ and high molecule alcohols, or carboxylic acid in organic solvents.

FIG. 7 is a flowchart illustrating a variation in the method for forming a rare earth element-doped SiO$_2$ precursor with nc Si particles. The method starts at Step 700. Step 702 mixes rare earth-embedded Si particles into a first organic solvent, such as Er, Yb, Ce, Pr, or Tb. Step 704 filters the first solution to remove large Si particles. Typically, particles greater than about 200 Å are removed. Step 706 adds a second solvent to the filtered first solution, having a higher boiling point than the first solvent. Step 708 fractionally distills the filtered first solution, creating a second solution of nc Si particles. Step 710 mixes the second solution with a SiO2 spin-on precursor solution, creating a rare earth element-doped $SiO_2$ precursor with nc Si particles.

In one aspect, mixing rare earth-embedded Si particles into a first organic solvent in Step 702 includes substeps. Step 702a immerses a porous Si layer overlying a Si wafer into a first organic solvent. Step 702b embeds rare earth element particles into the porous Si layer under an electric field. Step 702c ultrasonically removes rare earth-embedded Si particles from the porous Si layer of the Si wafer.

In another aspect, Step 701a provides a Si wafer. Step 701b immerses the Si wafer into a third solution including hydrofluoric (HF) acid and alcohol. In one aspect, the Si wafer is immersed at a rate in the range of about 0.1 to 0.5 millimeters per minute. In another aspect, about 49% HF is used with an alcohol such as methanol or ethanol. Step 701c applies an electric bias to the Si wafer. Step 701d forms the porous Si layer overlying the Si wafer.

In one aspect, mixing rare earth-embedded Si particles into a first organic solvent (Step 702) includes mixing rare earth-embedded Si particles into a solvent such as acetone or tetrahydrofuran.

In another aspect, fractionally distilling the filtered first solution in Step 708 includes substeps. Step 708a adds 2-methoxethanol to the filtered first solution. Step 708b fractionally boils to distill off the first solvent.

A rare earth element-doped silicon oxide ($SiO_2$) precursor has been provided with nanocrystalline (nc) Si particles. Some solvents and process specifics have been given to illustrate the precursor fabrication. However, the invention is not limited to just these examples. Other variations and embodiments of the invention will occur to those skilled in the art.

We claim:

1. A method for forming a rare earth element-doped silicon oxide ($SiO_2$) precursor with nanocrystalline (nc) Si particles, the method comprising:
    mixing rare earth-embedded Si particles into a first organic solvent, creating a first solution;
    filtering the first solution to remove the rare earth-embedded Si particles;
    adding a second solvent to the filtered first solution, having a higher boiling point than the first organic solvent; and,
    fractional distilling the filtered first solution, creating a second solution of nc Si particles.

2. The method of claim 1 wherein mixing rare earth-embedded Si particles into the first organic solvent includes:
    immersing a porous Si layer overlying a Si wafer into the first organic solvent;
    embedding rare earth element particles into the porous Si layer under an electric field; and,
    ultrasonically removing rare earth-embedded Si particles from the porous Si layer of the Si wafer.

3. The method of claim 2 further comprising: providing the Si wafer;
    immersing the Si wafer into a third solution comprising hydrofluoric (HF) acid and alcohol;
    applying an electric bias to the Si wafer; and,
    forming the porous Si layer overlying the Si wafer.

4. The method of claim 3 wherein immersing the Si wafer into the third solution includes immersing the Si wafer at a rate in the range of about 0.1 to 0.5 millimeters per minute (mm/min).

5. The method of claim 3 wherein the third solution comprises hydrofluoric (HF) acid and alcohol having about 49% HF in the third solution.

6. The method of claim 1 wherein mixing rare earth-embedded Si particles into the first organic solvent includes mixing rare earth-embedded Si particles into a solvent selected from the group consisting of acetone and tetrahydrofuran.

7. The method of claim 1 wherein filtering the first solution to remove the rare earth-embedded Si particles includes filtering to remove the rare earth-embedded Si particles larger than about 200 Å.

8. The method of claim 1 wherein fractionally distilling the filtered first solution includes:
    adding 2-methoxethanol to the filtered first solution; and,
    fractionally boiling to distill off the first organic solvent.

9. The method of claim 1 wherein mixing rare earth-embedded Si particles into the first organic solvent includes mixing rare earth element particles selected from the group consisting of erbium (Er), ytterbium (Yb), cerium (Ce), praseodymium (Pr), and terbium (Tb).

10. The method of claim 1 further comprising:
    mixing the second solution with a $SiO_2$ spin-on precursor solution, creating a rare earth element-doped $SiO_2$ precursor with nc Si particles.

11. A method for forming a rare earth element-doped silicon oxide ($SiO_2$) precursor with nanocrystalline (nc) Si particles, the method comprising:
    mixing rare earth-embedded Si particles into a first organic solvent, creating a first solution;
    filtering the first solution to remove the rare earth-embedded Si particles;
    adding a second solvent to the filtered first solution, having a higher boiling point than the first organic solvent;
    fractionally distilling the filtered first solution, creating a second solution of nc Si particles; and,
    mixing the second solution with a SiO2 spin-on precursor solution, creating a rare earth element-doped SiO2 precursor with nc Si particles.

* * * * *